US010090026B2

(12) United States Patent
Lee et al.

(10) Patent No.: US 10,090,026 B2
(45) Date of Patent: Oct. 2, 2018

(54) APPARATUSES AND METHODS FOR PROVIDING INTERNAL MEMORY COMMANDS AND CONTROL SIGNALS IN SEMICONDUCTOR MEMORIES

(71) Applicant: MICRON TECHNOLOGY, INC., Boise, ID (US)

(72) Inventors: Hyun Yoo Lee, Boise, ID (US); Jongtae Kwak, Boise, ID (US); Suryanarayana Tatapudi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/445,795

(22) Filed: Feb. 28, 2017

(65) Prior Publication Data

US 2018/0247690 A1    Aug. 30, 2018

(51) Int. Cl.
*G11C 7/00*       (2006.01)
*G11C 11/4076*    (2006.01)
*G11C 11/408*     (2006.01)
*G11C 11/4096*    (2006.01)
*G06F 1/12*       (2006.01)
*G11C 11/4093*    (2006.01)
(Continued)

(52) U.S. Cl.
CPC .............. *G11C 7/00* (2013.01); *G06F 1/12* (2013.01); *G11C 7/10* (2013.01); *G11C 11/4076* (2013.01); *G11C 11/4087* (2013.01); *G11C 11/4093* (2013.01); *G11C 11/4096* (2013.01); *G11C 19/00* (2013.01)

(58) Field of Classification Search
CPC ............ G11C 11/4076; G11C 11/4087; G11C 11/4093; G11C 11/4096; G06F 1/12
See application file for complete search history.

(56) References Cited

U.S. PATENT DOCUMENTS

| 6,029,252 A * | 2/2000 | Manning ................... G06F 1/06 713/600 |
| 6,178,133 B1 * | 1/2001 | Manning ................... G11C 8/08 365/189.05 |

(Continued)

OTHER PUBLICATIONS

U.S. Appl. No. 15/445,935 entitled 'Apparatuses and Methods for Determining a Phase Relationship Between an Input Clock Signal and a Multiphase Clock Signal' filed Feb. 28, 2017.

(Continued)

*Primary Examiner* — Ajay Ojha

(74) *Attorney, Agent, or Firm* — Dorsey & Whitney, LLP

(57) ABSTRACT

In an example apparatus, a command path receives read commands and provides respective control signals for each read command. The command path is configured to provide initial control signals for an initial read command responsive to a first clock edge of a clock signal of a plurality of multiphase clock signals and to further provide respective control signals for subsequent read commands responsive to receipt of the subsequent read commands. The example apparatus further includes a read data output circuit configured to receive the control signals from the command path and further receive read data in parallel. The read data output circuit is configured to provide the read data serially responsive to the control signals.

20 Claims, 8 Drawing Sheets

(51) Int. Cl.
    *G11C 7/10*    (2006.01)
    *G11C 19/00*   (2006.01)

(56) References Cited

U.S. PATENT DOCUMENTS

| | | | | |
|---|---|---|---|---|
| 6,178,488 B1* | 1/2001 | Manning | ............. | G06F 13/4243 |
| | | | | 710/36 |
| 6,202,119 B1* | 3/2001 | Manning | ............. | G11C 7/1039 |
| | | | | 711/104 |
| 6,279,090 B1* | 8/2001 | Manning | ............. | G11C 7/22 |
| | | | | 711/105 |
| 6,301,322 B1* | 10/2001 | Manning | ............. | G11C 19/00 |
| | | | | 326/94 |
| 6,338,127 B1* | 1/2002 | Manning | ............. | G06F 1/12 |
| | | | | 711/167 |
| 6,434,684 B1* | 8/2002 | Manning | ............. | G06F 5/06 |
| | | | | 365/189.15 |
| 6,484,244 B1* | 11/2002 | Manning | ............. | G06F 13/1615 |
| | | | | 365/230.03 |
| 9,531,363 B2 | 12/2016 | Miyano | | |
| 2001/0028599 A1 | 10/2001 | Aikawa | | |
| 2008/0056019 A1 | 3/2008 | Kim et al. | | |
| 2008/0291759 A1 | 11/2008 | Lee | | |
| 2010/0254198 A1* | 10/2010 | Bringivijayaraghavan | ............. | G11C 7/1078 |
| | | | | 365/189.05 |
| 2011/0116330 A1 | 5/2011 | Kim et al. | | |
| 2013/0265835 A1 | 10/2013 | Lee | | |
| 2014/0015575 A1 | 1/2014 | Jung | | |
| 2014/0055184 A1 | 2/2014 | Vankayala | | |
| 2017/0140808 A1 | 5/2017 | Jung et al. | | |

OTHER PUBLICATIONS

U.S. Appl. No. 15/692,993, entitled "Apparatuses and Methods for Providing Active and Inactive Clock Signals", filed Aug. 31, 2017.
International Search Report and Written Opinion received for PCT Application No. PCT/US2018/019781 dated Jun. 4, 2018.

* cited by examiner

APPARATUSES AND METHODS FOR PROVIDING INTERNAL MEMORY COMMANDS AND CONTROL SIGNALS IN SEMICONDUCTOR MEMORIES

BACKGROUND

Semiconductor memories are used in many electronic systems to store data that may be retrieved at a later time. As the demand for electronic systems to be faster, have greater computing ability, and consume less power has increased, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller. The command signals may control the semiconductor memories to perform various memory operations, for example, a read operation to retrieve data from a memory, and a write operation to store data to the memory. With newly developed memories, the memories may be provided with system clock signals that are used for timing command signals and address signals, for example, and further provided with data clock signals that are used for timing read data provided by the memory and for timing write data provided from the memory.

In typical designs, read data is provided by a memory at a known timing relative to receipt of an associated read command by the memory. The known timing is defined by read latency information RL. Similarly, write data is received by a memory at a known timing relative to receipt of an associated write command by the memory. The known timing is defined by write latency information WL. The RL information and WL information are typically defined by numbers of clock cycles of the system clock signals. For example, RL information may define a RL of 18 clock cycles of the system clock signals (tCKs). As a result, read data will be provided by a memory 18 tCKs after the read command is received by the memory. The RL information and WL information may be programmed in the memory by a memory controller.

With regards to memory designs using data clock signals, the data clock signals are provided to a memory (e.g., from a memory controller) to synchronize provision of read data or receipt of write data by the memory. The data clock signals are provided according to a specification to have a timing following the receipt of a memory command in order to provide data or receive data sufficient to meet the RL/WL information. The memory responds to the active data clock signals and provides or receives the data accordingly.

With the desire for faster performing memories, faster clock signals are used to clock the memories. The faster clock signals, however, present greater challenges for memories to perform any associated memory operations and with the correct timing.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
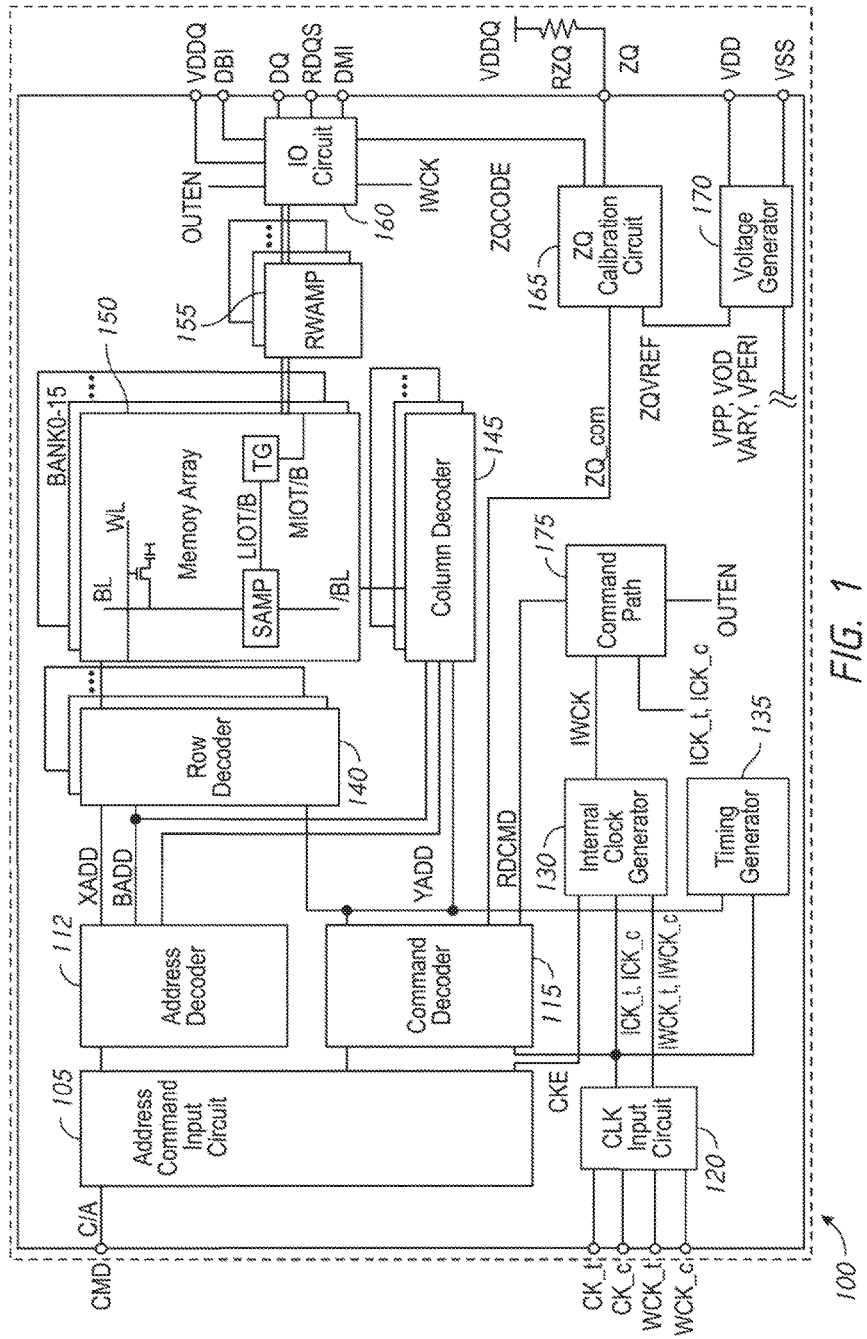
FIG. 1 is a block diagram of a block diagram of a semiconductor device according to an embodiment of the disclosure.

FIG. 1 is a block diagram of a block diagram of a semiconductor device 100 according to an embodiment of the disclosure. The semiconductor device 100 includes a memory die. The memory die may include an address/command input circuit 105, address decoder 112, command decoder 115, clock input circuit 120, internal clock generator 130, timing generator 135, row decoder 140, column decoder 145, memory arrays 150, read/write amplifiers 155, input-output (IO) circuit 160, ZQ calibration circuit 165, and voltage generator 170.

In some embodiments, the semiconductor device 100 may include, without limitation, a DRAM device, such as low power DDR (LPDDR) memory integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least one main I/O line pairs (MIOT/B), via transfer gates (TG), which function as switches.

The semiconductor device 100 may employ a plurality of external terminals that include address and command terminals coupled to command/address bus (C/A), clock terminals CK_t and CK_c, write clock terminals WCK_t and WCK_c, data terminals DQ, RDQS, DBI, and DMI, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 105, to an address decoder 112. The address decoder 112 receives the address signal and supplies a decoded row address signal to the row decoder 140, and a decoded column address signal to the column decoder 145. The address decoder 112 also receives the bank address signal and supplies the bank address signal to the row decoder 140, the column decoder 145.

The command/address terminals may further be supplied with a command signal CMD from outside, such as, for example, a memory controller. The command signal CMD may be provided, via the C/A bus, to the command decoder 115 via the address/command input circuit 105. The command decoder 115 decodes the command signal CMD to generate various internal commands that include a row command signal to select a word line and a column command signal, such as a read command RDCMD or a write command WRCMD, to select a bit line. Each read command RDCMD and write command WRCMD provided by the command decoder 115 is associated with a read command and write command provided to the semiconductor device 100. Various internal commands, for example read commands and write commands, are provided to a command path 175. The command path 175 may include a read command path that receives read commands RDCMD and provides control signals OUTEN. The control signals are provided to various circuits of the semiconductor device 100 to perform operations related to the read commands, such as providing read data.

For example, when a read command is issued and a row address and a column address are timely supplied with the read command, read data is read from a memory cell in the memory array 150 designated by these row address and column address. The read command is received by the read path, which provides control signals to input/output circuit 160 so that read data is output to outside from the data terminals DQ, RDQS, DBI, and DMI via read/write amplifiers 155 and the input/output circuit 160 according to the WCK and WCKF clock signals. The read data is provided at a time defined by read latency information RL that may be programmed in the semiconductor device, for example, in a mode register (not shown in FIG. 1). The read latency information RL may be defined in terms of clock cycles of the CK clock signal. For example, the read latency information RL may be a number of clock cycles of the CK signal after the read command is received by the semiconductor device 100 when the associated read data is provided.

When the write command is issued and a row address and a column address are timely supplied with this command, and then write data is supplied to the data terminals DQ and DMI according to the WCK and WCKF clock signals, the write command is received by the command path 175, which provides control signals to the input/output circuit 160 so that the write data is received by data receivers in the input/output circuit 160, and supplied via the input/output circuit 160 and the read/write amplifiers 155 to the memory array 150 and written in the memory cell designated by the row address and the column address. The write data is provided to the data terminals at a time that is defined by write latency WL information. The write latency WL information may be programmed in the semiconductor device 100, for example, in the mode register (not shown in FIG. 1). The write latency WL information may be defined in terms of clock cycles of the CK clock signal. For example, the write latency information WL may be a number of clock cycles of the CK signal after the write command is received by the semiconductor device 100 when the associated write data is provided.

Turning to the explanation of the external terminals included in the semiconductor device 100, the clock terminals CK_t and CK_c, and WCK_t and WCK_c are supplied with external clock signals and complementary external clock signals. The external clock signals CK_t, CK_c and WCK_t and WCK_c may be supplied to a clock input circuit 120. The clock input circuit 120 may receive the external clock signals to generate internal clock signals ICK_t, ICK_c and IWCK_t, IWCK_c. The internal clock signals ICK_t and ICK_c are supplied to an internal clock generator 130. The internal clock generator 130 provides various phase and frequency controlled internal clock signals based on the received internal clock signals and a clock enable signal CKE from the address/command input circuit 105. For example, the internal clock generator 130 provides multiphase clock signals IWCK based on the internal clock signals IWCK_t and IWCK_c. As will be described in more detail below, the multiphase clock signals IWCK have relative phases to each other. The multiphase clock signals IWCK may be provided to the command path 175. The multiphase clock signals IWCK may also be provided to the input/output circuit 160 and are used with the control signals OUTEN for determining an output timing of read data and the input timing of write data.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. The reference potential ZQVREF is used in the ZQ calibration circuit 165.

The power supply terminal is also supplied with power supply potential VDD. The power supply potentials VDDQ is supplied to the input/output circuit 160 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potentials VDDQ and VSSQ are used for the input/output circuit 160 so that power supply noise generated by the input/output circuit 160 does not propagate to the other circuit blocks.

The calibration terminal ZQ is connected to the ZQ calibration circuit 165. The ZQ calibration circuit 165 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 160, and thus an impedance of an output buffer (not shown) included in the input/output circuit 160 is specified.

Figure 2:
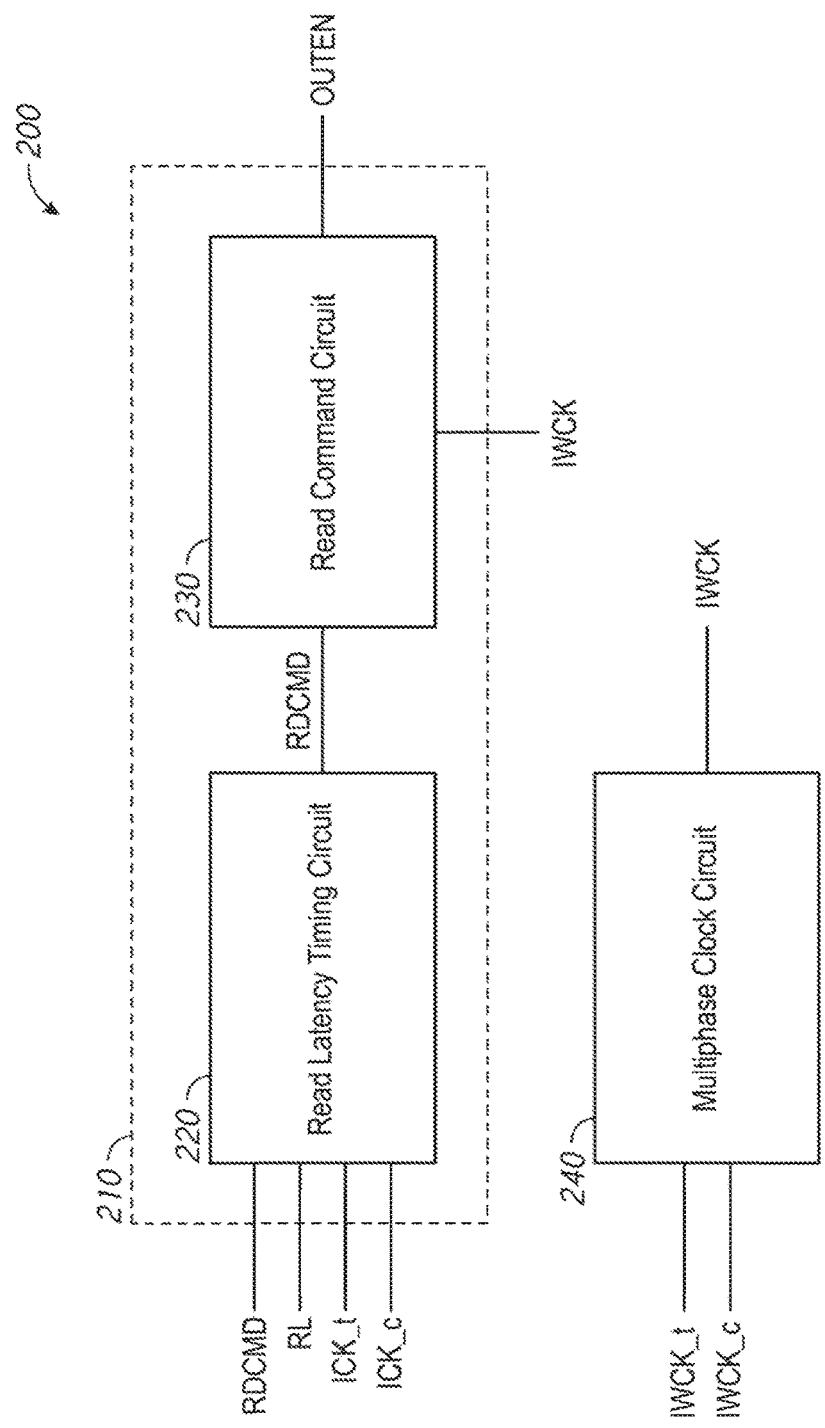
FIG. 2 is a block diagram of a read command path and a multiphase clock circuit according to an embodiment of the disclosure.

FIG. 2 is a block diagram of a read command path 210 and a multiphase clock circuit 240 according to an embodiment of the disclosure. The read command path 210 may be included in the command path 175 of FIG. 1 in an embodiment of the disclosure. The multiphase clock circuit 240 may be included in the internal clock generator 130 of FIG. 1 in an embodiment of the disclosure.

The read command path 210 includes a read latency timing circuit 220 and a read command circuit 230. The read latency circuit 200 receives a read command RDCMD provided by the command decoder (e.g., command decoder 115) and further receives internal clock signals ICK_t and ICK_c (e.g., clock input circuit 120). Read latency information RL is also received by the read latency timing circuit 220. The read latency information represents information related to the timing of providing read data relative to receipt of an external read command by the semiconductor device 100. The read latency information RL may be defined in terms of clock cycles of the CK clock signal, for example, the read data for an associated read command is provided Z clock cycles of the CK clock signal after the associated read command is received by the semiconductor device 100, where Z is a positive, whole number. The read latency information RL may be programmed in and provided by a mode register (not shown).

The read latency timing circuit 220 provides a delay to the read command RDCMD based on the read latency information. The read latency timing circuit 220 may include shift circuits (not shown) that shift the read command RDCMD through read latency timing circuit 220 according to internal clock signals ICK_t and ICK_c to and based on the read latency information RL. The read latency timing circuit 220 provides the read command RDCMD to the read command circuit 230.

The multiphase clock circuit 240 receives internal clock signals IWCK_t and IWCK_c from a clock input circuit (e.g., clock input circuit 120), and provides multiphase clock signals IWCK. In an embodiment of the disclosure, the multiphase clock circuit 240 provides multiphase IWCK clock signals having relative phases to each other. For example, the multiphase clock circuit 240 may provide IWCK0 and IWCK180 clock signals, where the IWCK180 clock signal that is 180 degrees out of phase from the IWCK0 clock signal. In such an embodiment, the multiphase clock circuit 240 provides two phase clock signals, that is, the IWCK0 clock signal and the IWCK180 clock signal. In another embodiment, the multiphase clock circuit 240 may provide additional clock signals, for example, four phase clock signals (e.g., IWCK0, IWCK90, IWCK180, IWCK270, each clock signal 90 degrees out of phase relative to the other clock signals). The IWCK clock signal may have a clock frequency that is one-half a clock frequency of the IWCK_t and IWCK_c clock signals. In an embodiment where the IWCK_t and IWCK_c clock signals have the same frequency as the WCK_t and WCK_c clock signals, the IWCK clock signals may have one-half a clock frequency of the WCK_t and WCK_c clock signals.

The read command circuit 230 receives the read command RDCMD and the multiphase IWCK clock signals. The read command circuit 230 provides control signals OUTEN that may be used to control the output of read data associated with the corresponding read commands RDCMD. The read command circuit 230 provides the control signals OUTEN responsive to the multiphase IWCK clock signals having the timing necessary to provide the read data associated with the corresponding read commands RDCMD to satisfy the read latency information RL. Initial control signals OUTEN for an initial read command RDCMD are based on activation of a multiphase IWCK clock signal. As previously described, the multiphase clock signals are based on the WCK_t and WCK_c clock signals. Control signals OUTEN for subsequent, consecutive read commands RDCMD are provided by propagating the subsequent, consecutive read commands RDCMD through a command circuit.

Activation of the IWCK clock signal reflects activation of the WCK_t, WCK_c clock signals, as well as activation of the IWCK_t, IWCK_c clock signals. That is, activation of the IWCK clock signal represents activation of the IWCK_t, IWCK_c clock signals, and of the WCK clock signals. When the multiphase IWCK clock signal (and the IWCK_t, IWCK_c, and WCK clock signals) is activated, the IWCK clock signal begins to periodically transition between a high and low clock signal, the first transition represented by an initial clock edge (e.g., a first rising clock edge). An initial clock edge of the IWCK clock signal may represent activation of the IWCK clock signal in some embodiments of the disclosure. Likewise, an initial clock edge of the WCK clock signal may represent activation of the WCK clock signal. The WCK clock signal may be activated, for example, by a memory controller providing the WCK clock signal, when read data is anticipated to be provided. The read data is provided to the memory controller synchronized with the WCK clock signal.

The read command path 210 provides control signals OUTEN to provide read data for associated read commands to satisfy the read latency information RL. The WCK clock signals may be active when providing read data. However, the WCK clock signals may not be active at other times. Thus, the WCK clock signals may not be continuously active, and may become active when reading data.

Providing the initial control signals OUTEN for the initial read command RDCMD based on activation of the multiphase IWCK clock signal may allow the semiconductor device 100 to provide the control signals OUTEN having the timing necessary to provide the read data associated with the initial read command RDCMD to satisfy the read latency information RL with fewer initial clock cycles of the WCK clock signal after activation of the WCK clock signal. Fewer initial clock cycles of the WCK clock signal may reduce power consumption of the semiconductor device 100 during operation. Additionally, relying on the activation of the multiphase IWCK clock signal to provide the initial control signals for the initial read command RDCMD may result in greater time for clock circuits of the semiconductor device 100 to adjust the timing (e.g., phase, frequency, etc.) of the multiphase IWCK clock signals for use when providing control signals for subsequent read commands RDCMD, which are based on the subsequent read commands themselves.

Figure 3:
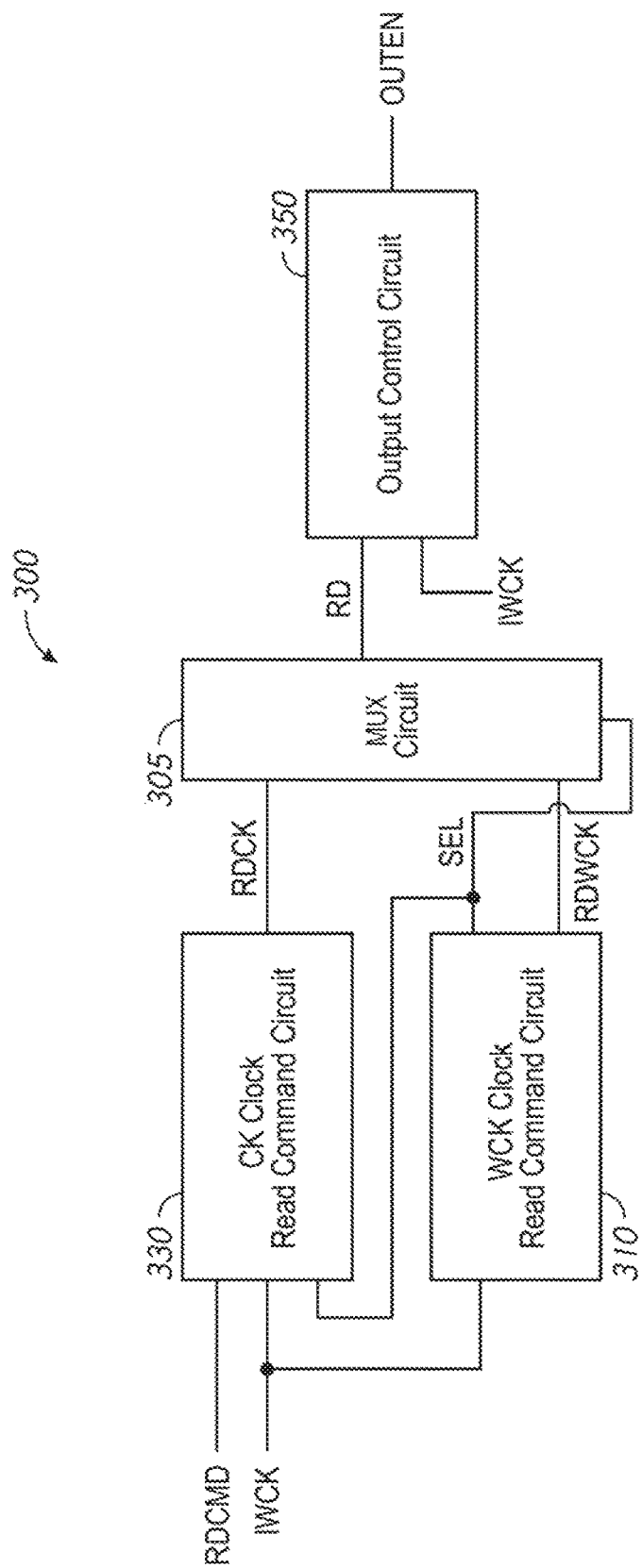
FIG. 3 is a block diagram of read command circuit according to an embodiment of the disclosure.

FIG. 3 is a block diagram of read command circuit 300 according to an embodiment of the disclosure. The read command circuit 300 may be used for the read command circuit 230 of FIG. 2 and included in the command path 175 of FIG. 1. The read command circuit 300 includes a WCK clock read command circuit 310 and a CK clock read command circuit 330. The WCK clock read command circuit 310 receives multiphase clock signals IWCK, which are based on the WCK_t and WCK_c clock signals, and provides an internal read command RDWCK responsive to the multiphase clock signals IWCK. The CK clock read command circuit 330 receives the read command RDCMD and the multiphase clock signals IWCK, and provides an internal read command RDCK responsive to the read command RDCMD and IWCK clock signals. The internal read commands RDWCK and RDCK are provided to a multiplexer circuit 305. The multiplexer circuit 305 provides either the RDCK or RDWCK internal read command to an internal read command RD based on a control signal SEL. The control signal SEL is provided by the WCK clock read command circuit 310. The read command circuit 300 further includes an output control circuit 350. The output control circuit 350 receives the internal read command RD and the IWCK clock signals. The output control circuit 350 provides control signals OUTEN that may be used to control an output circuit (e.g., included in the input/output circuit 160) to provide read data. The control signals OUTEN are provided to the output circuit having a timing to satisfy the read latency information RL.

In operation, the read command circuit 300 provides control signals OUTEN to provide read data satisfying read latency information RL. The WCK clock read command circuit 310 provides the internal read command RDWCK responsive to activation of the IWCK clock signal (e.g., an initial edge of the IWCK clock signal). The CK clock read command circuit 330 provides the internal read command RDCK responsive to read commands RDCMD. The internal read command RDWCK is provided by the multiplexer circuit 305 as an initial internal read command RD and the internal read commands RDCK are provided by the multiplexer circuit 305 as subsequent internal read commands RD. The initial internal read command RD is provided to the output control circuit 350, which in turn provides initial control signals OUTEN to activate output circuits to provide read data. The subsequent internal read commands RD are provided to the output control circuit 350 to in turn provide subsequent control signals OUTEN to continue to activate the output circuit to provide read data.

As previously described, providing the initial control signals OUTEN for the initial read command RDCMD based on activation of the multiphase IWCK clock signal and providing control signals OUTEN for subsequent read commands RDCMD based on the subsequent read commands themselves may reduce power consumption, and may also provide additional time to adjust the timing of the multiphase IWCK clock signals if necessary.

Figure 4:
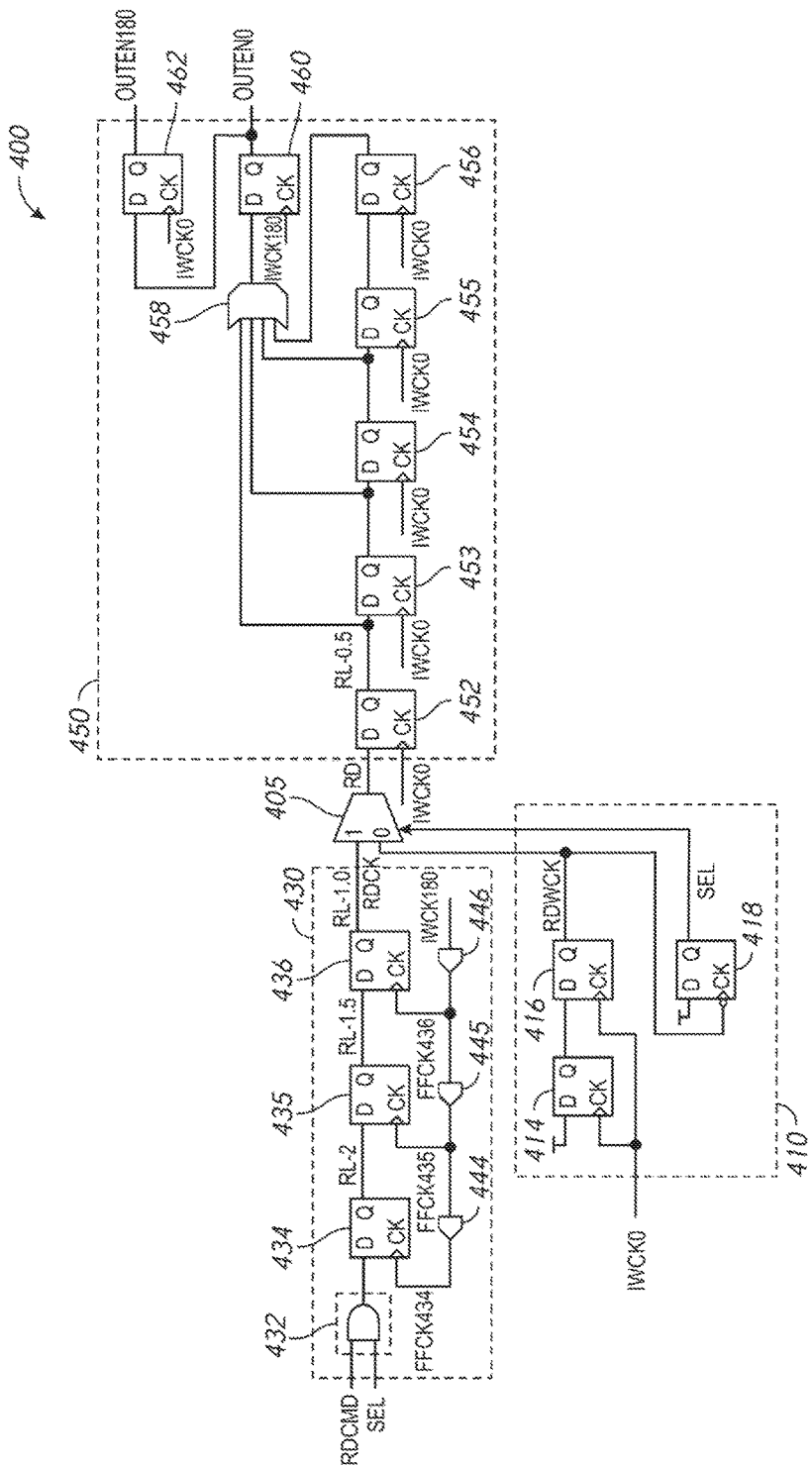
FIG. 4 is a schematic diagram of a read command circuit according to an embodiment of the disclosure.

FIG. 4 is a schematic diagram of a read command circuit 400 according to an embodiment of the disclosure. The read command circuit 400 may be used for the read command circuit 230 of FIG. 2 or the read command circuit 300 of FIG. 3. The read command circuit 400 includes a WCK clock read command circuit 410 and a CK clock read command circuit 430. The WCK clock read command circuit 410 provides an internal read command RDWCK responsive to a multiphase clock signal IWCK, which is based on the WCK_t and WCK_c clock signals. The IWCK clock signal received by the WCK read command circuit 410 is included in the multiphase clock signals IWCK, which as previously described, may be multiphase clock signals having relative phases to each other and may have a clock frequency that is one-half of the clock frequency of the externally provided WCK_t and WCK_c clock signals. The internal WCK clock signals may be provided by an internal clock generator of the semiconductor device 100, for example, the internal clock generator 130. In an embodiment of the disclosure, the WCK clock read command circuit 410 receives the zero-degree phase IWCK clock signal IWCK0.

The internal read command RDWCK may be provided by the WCK clock read command circuit 410 responsive to activation of a multiphase IWCK clock signal. Activation of the IWCK clock signal reflects activation of the WCK_t, WCK_c clock signals, as well as activation of the IWCK_t, IWCK_c clock signals. That is, activation of the IWCK clock signal represents activation of the IWCK_t, IWCK_c clock signals, and of the WCK clock signals. When the multiphase IWCK clock signal (and the IWCK_t, IWCK_c, and WCK clock signals) is activated, the IWCK clock signal begins to periodically transition between a high and low clock signal, the first transition represented by an initial clock edge (e.g., a first rising clock edge). Thus, an initial clock edge of the IWCK clock signal may represent activation of the IWCK clock signal. Likewise, an initial clock edge of the WCK clock signal may represent activation of the WCK clock signal. The WCK clock signal may be activated, for example, by a memory controller providing the WCK clock signal, when read data is anticipated to be provided. The read data is provided to the memory controller synchronized with the WCK clock signal.

The CK clock read command circuit 430 provides an internal read command RDCK responsive to the read command RDCMD. The CK clock read command circuit 430 receives the read command RDCMD and an IWCK clock signal. In an embodiment of the disclosure, the CK clock read command circuit 430 receives the 180 degree phase IWCK clock signal IWCK180. The IWCK180 clock signal has a relative phase of 180 degrees to the IWCK0 clock signal. The CK clock read command circuit 430 provides the internal read command RDCK responsive to the read command RDCMD.

The read command circuit 400 further includes a multiplexer circuit 405. The CK clock read command circuit 430 provides the internal read command RDCK to a first input of the multiplexer circuit 405 and the WCK clock read command circuit 410 provides the internal read command RDWCK to a second input of the multiplexer circuit 405. The multiplexer circuit 405 provides either the RDCK or RDWCK internal read command to an internal read command RD based on a control signal SEL.

As will be described in more detail below, the read command circuit 400 may be used to provide an initial internal read command RD responsive to the activation (e.g., start) of the WCK clock signal (e.g., represented by an initial clock edge of the WCK clock signal), and further provide subsequent internal read commands RD thereafter responsive to subsequent read commands RDCMD. The timing of the initial and subsequent internal read commands RD provided by the read command circuit 400 provide proper timing for the semiconductor device 100 in providing output data DQ relative to receipt of external read commands READ according to a read latency RL.

The WCK clock read command circuit 410 includes flip-flop (FF) circuits 414, 416, and 418. A data input of the FF circuit 414 is coupled to a supply voltage, which provides a logic high level to the data input of the FF circuit 414. An output of the FF circuit 414 is coupled to a data input of the FF circuit 416, which provides the internal read command RDWCK to the second input of the multiplexer circuit 405. The FF circuits 414 and 416 receive at respective clock inputs the IWCK0 clock signal. The output of the FF circuit 416 is also coupled to a clock input of the FF circuit 418. An output of the FF circuit 418 provides the control signal SEL to the multiplexer circuit 405. The control signal SEL is also provided to the input logic circuit 432 to control provision of the read command RDCMD through the logic circuit to the FF circuit 434.

The CK clock read command circuit 430 includes an input logic circuit 432 that receives the read command RDCMD and the control signal SEL. In an embodiment, the input logic circuit 432 includes an AND logic circuit, as shown in FIG. 4. The CK clock read command circuit 430 further includes FF circuits 434, 435, 436. The FF circuits 434-438 are coupled in series and are each clocked by a respective clock signal FFCK434, FFCK435, and FFCK436. The CK clock read command circuit 430 further includes delay circuit 444, 445, and 446. The delay circuits 444-446 are coupled in series and each provides the respective clock signals FFCK434-FFCK436. For example, the delay circuit 444 provides the clock signal FFCK434, the delay circuit 445 provides the clock signal FFCK435, the delay circuit 446 provides the clock signal FFCK436. The delay circuit 446 receives the IWCK180 clock signal in an embodiment of the disclosure, as shown in FIG. 4.

Each succeeding clock signal provided by the delay circuits 445-446 has greater delay relative to a preceding clock signal and to the IWCK180 clock signal. For example, the FFCK435 clock signal has a delay relative to the FFCK436 clock signal, and greater relative delay to the IWCK180 clock signal than the FFCK436 clock signal. Similarly, the FFCK434 clock signal has a delay relative to the FFCK435 clock signal, and greater relative delay to the IWCK180 clock signal than the FFCK435 clock signal. The FFCK434 clock signal has the greatest delay relative to the IWCK180 clock signal of the FFCK clock signals.

The delay circuits 444-446 provide additional delay to the IWCK180 clock signal so that the FF circuit 434 is clocked by the FFCK434 clock signal at a time when the read command RDCMD is available to the latched. The time for the read command RDCMD to reach the input logic circuit 432 is greater than the time for the IWCK clock signal to reach the FF circuit 434 due to delay from, for example, decoding an external read command to provide the read command RDCMD, and then propagating through the read command path, for example, through a read latency timing circuit. The delay circuits 444-446 provide additional delay for the difference in propagation time between the read command RDCMD and activate IWCK clock signals.

The read command circuit 400 further includes an output control circuit 450. The output control circuit 450 may be used as the output control circuit 350 of FIG. 3 in an embodiment of the disclosure. The output control circuit 450 includes FF circuits 452-456 coupled in series with outputs of the FF circuits 452-455 coupled to data inputs of the following FF circuits 453-456. The outputs of the FF circuits 452-456 are also provided to a logic circuit 458. In an embodiment of the disclosure, the logic circuit 458 may be an OR logic circuit, as shown in FIG. 4. The FF circuits 452-456 each receive the multiphase clock signal IWCK0. The FF circuit 452 receives the internal read command RD. The internal read command RD may be provided, for example, by the multiplexer circuit 405 that receives internal read commands RDWCK and RDCK. The output control circuit 450 may further include FF circuits 460 and 462. The FF circuit 460 receives at a data input an output from the logic circuit 458 and provides an output to a data input of the FF circuit 462. The FF circuit 460 receives the multiphase clock signal IWCK180 and provides a control signal OUTEN0, and the FF circuit 462 receives the multiphase clock signal IWCK0 and provides a control signal OUTEN180. The control signals OUTEN0 and OUTEN180 may be used to activate output circuits to provide read data for an associated read command.

As previously described, the read command RDCMD may be provided to the read command circuit 400 by a read latency timing circuit (e.g., read latency circuit 220), which provides a delay to the read command RDCMD based on the read latency information. The read command circuit 400 provides additional delay to the read command RDCMD so that the control signals OUTEN0 and OUTEN180 are provided with a timing to satisfy the read latency information RL. In the embodiment of FIG. 4, the read command circuit 400 adds 2.5 clock cycles of the IWCK clock signals. The WCK clock command circuit 430 adds an additional 1.5 clock cycles of the IWCK clock signals of delay the read command RDCMD as it is propagated through the FF circuits 434-436. A first half clock cycle of the IWCK clock signals is propagating the read command RDCMD1 through the FF circuit 434, a second half clock cycle of the IWCK clock signals is propagating the read command RDCMD1 through the FF circuit 435, and a third half clock cycle of the IWCK clock signals is propagating the read command RDCMD1 through the FF circuit 436. The output control circuit 450 adds another 1.0 clock cycles of the IWCK clock signals before the control signal OUTEN0 is first provided based on the internal read command RDCK. A first half clock cycle of the IWCK clock signals is for propagating the read command RDCK through the FF circuit 452 and a second half clock cycle of the IWCK clock signals is for propagating the read command RDCK (provided by the logic circuit 458) through the FF circuit 460. Thus, a total of 2.5 clock cycles of the IWCK clock signals of additional delay is added to provide the control signals OUTEN0 and OUTEN180 with timing to satisfy the read latency information RL.

Figure 5:
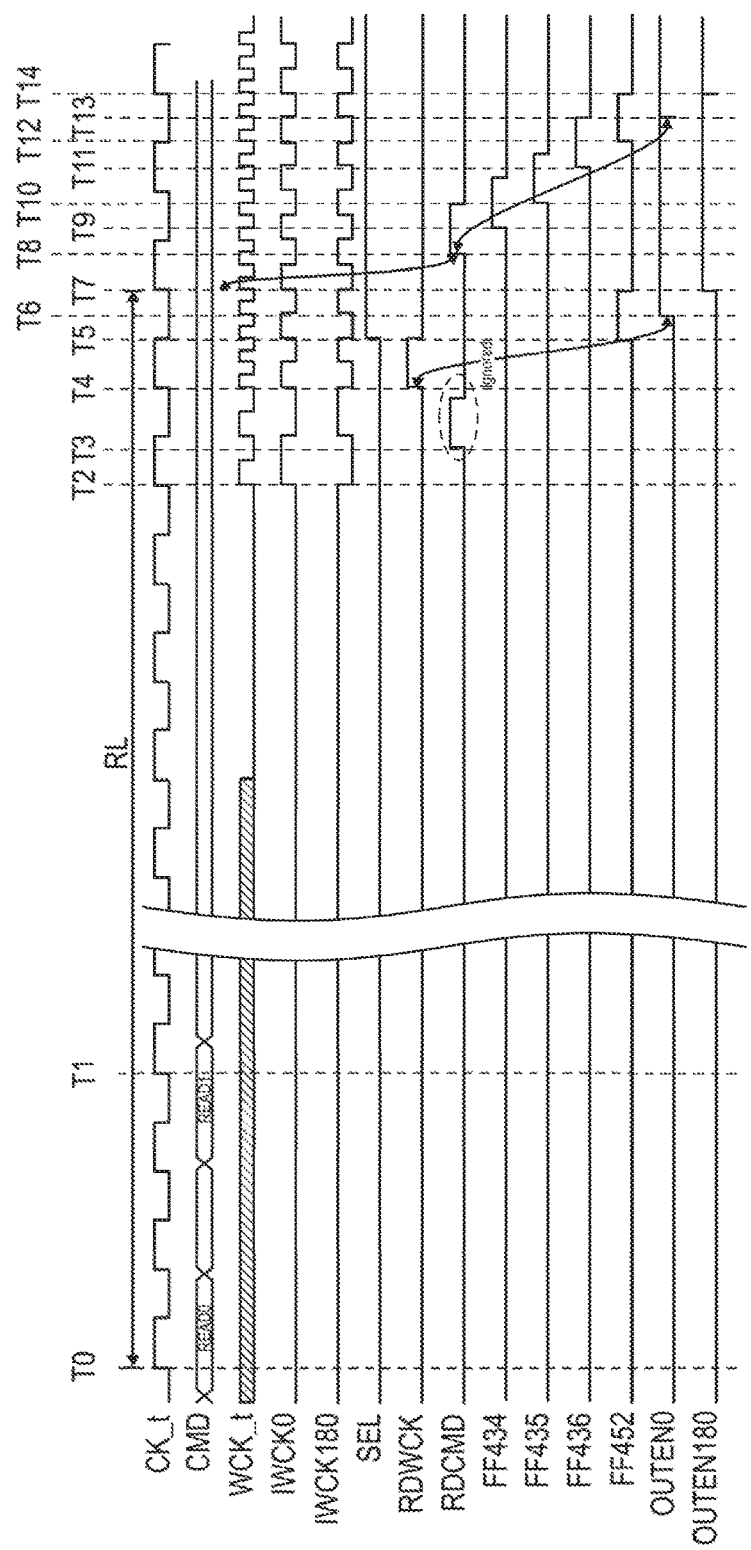
FIG. 5 is a timing diagram showing various signals during operation of read command circuit of FIG. 4 according to an embodiment of the disclosure.

An example operation of the read command circuit 400 will be described with reference to FIG. 5. FIG. 5 is a timing diagram showing various signals during operation of read command circuit 400 according to an embodiment of the disclosure. A first read command READ0 (e.g., an initial read command) is received by the semiconductor device 100 at time T0 responsive to a rising edge of the CK_t clock signal. Read latency information RL for the first read command READ0 is shown in FIG. 5 extending from receipt of the first read command READ0 at time T0 to when read data associated with the first read command READ0 is output from a IO circuit at time T7. A second read command READ1 (e.g., a subsequent read command) is received by the semiconductor device 100 at time T1 responsive to a rising edge of the CK_t clock signal. A corresponding read command RDCMD is provided by the command decoder 115 for each read command READ. With reference to FIG. 5, the read command RDCMD0 at time T3 corresponds to the read command READ0 and the read command RDCMD1 at time T8 corresponds to read command READ1.

FIG. 5 further illustrates the WCK_t clock signal and the multiphase clock signals IWCK0 and IWCK180, which are based on the WCK_t clock signal. As shown in FIG. 5, the IWCK0 and IWCK180 clock signals have a clock frequency that is one-half of a clock frequency of the WCK_t clock signal. As also shown in FIG. 5, both the WCK_t and IWCK0 clock signals initially have a first clock frequency when initially provided between times T2 and T4. However, following time T4, the clock frequency of the WCK_t and IWCK0 clock signals changes to a second clock frequency that is greater than the first clock frequency. In an embodiment of the disclosure, the second clock frequency is twice the clock frequency of the first clock frequency as shown in FIG. 5. The increase in clock frequency following time T4 may be specified in a timing specification for the semiconductor device 100.

In operation, responsive to activation of the WCK_t clock signal (and consequently, activation of the multiphase clock signals IWCK0 and IWCK180) at time T2, the FF circuit 414 of the WCK clock read command circuit 410 latches the high logic level provided to its data input and provides a high logic level to the data input of the FF circuit 416. Activation of the WCK_t and IWCK clock signals is represented by an initial clock edge (e.g., rising clock edge) at time T2.

The high logic level at the data input of the FF circuit 416 is latched at time T4 and provided as an active internal read command RDWCK to a second input of the multiplexer circuit 405. At time T4, the control signal SEL is at a low logic level from being reset prior to the initial rising edge of the IWCK0 clock signal. With the control signal SEL at a low logic level and the high logic level output by the FF circuit 416, the multiplexer circuit 405 provides the active internal read command RDWCK as an initial internal read command RD at time T4. The falling edge of the active internal read command RDWCK causes the FF circuit 418 to latch a high logic level (provided by a supply voltage) and provide a high logic level control signal SEL. The FF circuit 418 provides the high logic level control signal SEL after the active internal read command RDWCK is provided as the initial internal read command RD at time T4 by the multiplexer circuit 405. Thus, soon after time T4, the multiplexer circuit 405 will provide subsequent read commands RD from the CK clock read command circuit 430.

As previously described, the command READ0 causes a corresponding read command RDCMD0 to be provided to the read command path by the command decoder 115. The read command RDCMD0 is shown at time T3 in FIG. 3. The read command RDCMD0 is prevented from being provided to the FF circuit 434 by input logic circuit 432 due to the low logic level of the control signal SEL at the time the read command RDCMD0 is provide to the input logic circuit 432. In effect, the read command RDCMD0 is ignored by the CK clock read command circuit 430. However, the second read command RDCMD1, which corresponds to the read command READ1, is provided through the input logic circuit 432 because of the high logic level SEL signal provided by the FF circuit 418 prior to time T8.

The second read command RDCMD1 is received at a data input of the FF circuit 434 at time T8. The IWCK180 clock signal, which as previously described is 180 degrees out of phase with the IWCK0 clock signal, is delayed through the delay circuits 446, 445, and 444. A first rising edge of the IWCK180 clock signal is provided as a first rising edge of the FFCK434 clock signal to the clock input of the FF circuit 434 after being delayed by the delay circuits 444-446 to cause the FF circuit 434 to latch the second read command RDCMD1 at the data input. The active read command RDCMD1 is provided by the FF circuit 434 to a data input of the FF circuit 435. The active read command RDCMD1 provided by the FF circuit 434 to the FF circuit 435 is shown at time T9 of FF434.

A next rising edge of the IWCK180 clock signal is provided as a next rising edge of the FFCK435 clock signal to the clock input of the FF circuit 435 after being delayed by the delay circuits 445 and 446 to cause the FF circuit 435 to latch the second read command RDCMD1 at the data input. The active read command RDCMD1 is then provided by the FF circuit 435 to a data input of the FF circuit 436. The active read command RDCMD1 provided by the FF circuit 435 to the FF circuit 436 is shown at time T10 of FF435. A next rising edge of the IWCK180 clock signal is provided as a next rising edge of the FFCK436 clock signal to the clock input of the FF circuit 436 after being delayed by the delay circuit 446 to cause the FF circuit 436 to latch the second read command RDCMD1 at the data input. The second read command RDCMD1 is then provided by the FF circuit 436 to the first input of the multiplexer circuit 405 as the internal read command RDCK. The second read command RDCMD1 provided by the FF circuit 436 to the multiplexer circuit 405 as the internal read command RDCK is shown at time T11 of FF436. The FF circuit 436 provides the time shifted read command RDCMD as the internal read command RDCK to the multiplexer circuit 405 after being latched by the FF circuit 436.

At time T11, the control signal SEL is at a high logic level from being set by the active internal read command RDWCK clocking the FF circuit 416. With the control signal SEL at a high logic level and the high logic level output by the FF circuit 436, the multiplexer circuit 405 provides the active internal read command RDCK as a second internal read command RD at time T11. As previously described, the second read command RDCMD1 provided to the data input of the FF circuit 434 is shifted through the FF circuits 435 and 436 between times T8 and T11 to be provided as an active internal read command RDCK to the first input of the multiplexer circuit 405, which is provided as the second internal read command RD.

FIG. 5 further shows various signals during operation of the output control circuit 450 according to an embodiment of the disclosure. The active initial internal read command RD is latched by the FF circuit 452 at a rising edge of the IWCK0 clock signal, as at time T5. As previously described, the internal read command RDWCK is provided as the initial internal read command RD by the multiplexer circuit 405 at time T4. The internal read command RDWCK results from the first read command READ0 received at time T0. The initial internal read command RD is latched by the FF circuit 452 at time T5. The FF circuit 452 provides the initial internal read command RD to the logic circuit 458, which in turn provides a high logic level to the data input of the FF circuit 460. At a rising edge of the IWCK180 clock signal, the FF circuit 460 latches the high logic level and provides a high logic level control signal OUTEN0. The high logic level control signal OUTEN0 provided by the FF circuit 460 is shown at time T6. The high logic level output by the FF circuit 460 is also provided to the data input of the FF circuit 462. The FF circuit 462 latches the high logic level and provides a high logic level control signal OUTEN180 responsive to a following rising edge of the IWCK0 clock signal. The high logic level control signal OUTEN180 provided by the FF circuit 462 is shown at time T7.

The high logic level provided by the FF circuit 452 at time T5 is latched by the FF circuit 453 at a following rising edge of the IWCK0 clock signal. The high logic level is provided by the FF circuit 453 to the logic circuit 458 and to the FF circuit 454. The logic circuit 458 provides a high logic level to the data input of the FF circuit 460. At a following rising edge of the IWCK180 clock signal, the FF circuit 460 latches the high logic level and provides a high logic level control signal OUTEN0 to maintain the high logic level. At a following rising edge of the IWCK0 clock signal, the FF circuit 462 latches the high logic level of the FF circuit 460 and provides a high logic level control signal OUTEN180 to maintain the high logic level. As illustrated by the previous example, the initial internal read command RD is shifted through the FF circuits 452-456 to maintain a high logic level OUTEN0 control signal between times T6 and T13 and to maintain a high logic level OUTEN180 control signal between times T7 and T14.

The active second internal read command RD is latched by the FF circuit 452 at a rising edge of the IWCK0 clock signal, as at time T12. As previously described, the internal read command RDCK is provided as the second internal read command RD by the multiplexer circuit 405 at time T11. The internal read command RDCK results from the second read command READ1 received at time T1. The second internal read command RD is latched by the FF circuit 452 at time T12. The FF circuit 452 provides a high lock level to the logic circuit 458, which provides a high logic level to the data input of the FF circuit 460. At a rising edge of the IWCK180 clock signal, the FF circuit 460 latches the high logic level and provides a high logic level control signal OUTEN0 to maintain the high logic level from the initial internal read command. The high logic level control signal OUTEN0 provided by the FF circuit 460 is shown at time T13. The high logic level output by the FF circuit 460 is also provided to the data input of the FF circuit 462. The FF circuit 462 latches the high logic level and provides a high logic level control signal OUTEN180 responsive to a following rising edge of the IWCK0 clock signal. The high logic level provided by the FF circuit 462 maintains the high logic level of the control signal OUTEN180 resulting from the initial internal read command. The high logic level control signal OUTEN180 provided by the FF circuit 462 is shown at time T14.

As with the initial internal read command RD shifted through the FF circuits 452-456 responsive to the IWCK0 clock signal, the second internal read command RD is likewise shifted through the FF circuits 452-456 after receipt at time T11 by the FF circuit 452. As the second internal read command RD is shifted through the FF circuits 452-456, the OUTEN0 control signal is maintained at the high logic level following time T13 and the OUTEN180 control signal is maintained at the high logic level following time T14. As previously described, the OUTEN0 and OUTEN180 control signals may be used to activate output circuits to provide read data for an associated read command.

Figure 6A:
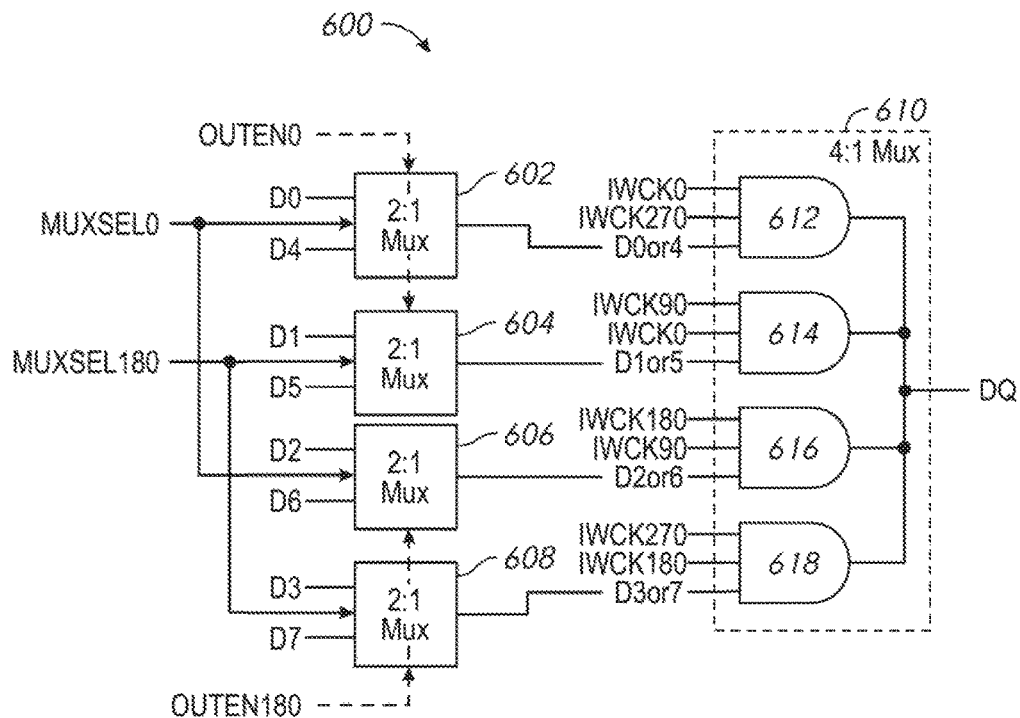
FIG. 6A is a block diagram of a read data output circuit according to an embodiment of the disclosure.
Figure 6B:
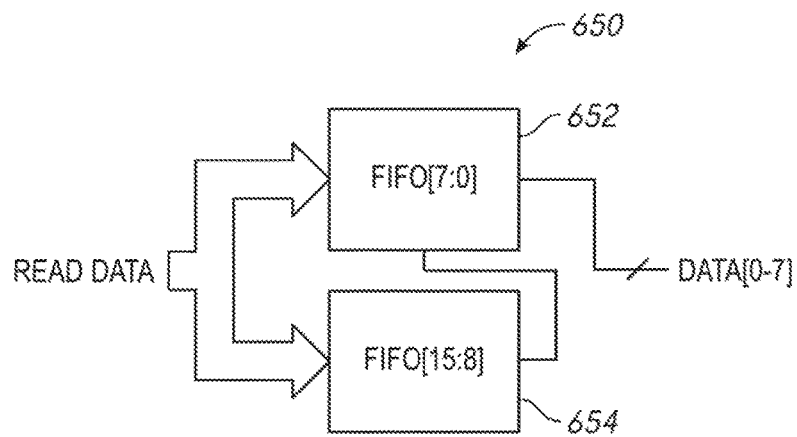
FIG. 6B is a block diagram of a data buffer circuit according to an embodiment of the disclosure.

FIG. 6A illustrates a read data output circuit 600 according to an embodiment of the disclosure. The read data output circuit 600 may be included in the IO circuit 60 in an embodiment of the disclosure. The read data output circuit 600 receives eight bits of data in parallel and provides the eight bits serially according to IWCK clock signals. The data bits may be provided in parallel to the read data output circuit 600 by a data buffer circuit. FIG. 6B illustrates a data buffer circuit 650 according to an embodiment of the disclosure. The data buffer circuit 650 includes a buffer circuit 652 and a buffer circuit 654. The buffer circuits 652 and 654 may be first-in-first-out (FIFO) buffer circuits in an embodiment of the disclosure, as shown in FIG. 6B. Read data is provided in parallel to the buffer circuits 652 and 654, for example, from memory array 150 by read/write amplifiers 155. In an embodiment of the disclosure, 16 bits of read data are provided to the data buffer circuit 650, with eight bits provided to the buffer circuit 652 and eight bits provided to the buffer circuit 654. Eight bits (e.g., read bits 0-7) may be provided in parallel to the read data output circuit 600 from the buffer circuit 654 at a first time. After the eight bits are provided at the first time, the eight bits (e.g., read bits 8-15) are moved from the buffer circuit 654 to the buffer circuit 652. Another eight bits (e.g., read bits 8-15) are provided in parallel to the read data output circuit 600 from the buffer 652 at a second time. In this manner, 16 read bits may be provided to the read data output circuit 600, in particular, eight bits in parallel at a first time, and then another eight bits in parallel at a second time.

Returning to FIG. 6A, the read data output circuit 600 includes multiplexer circuits 602, 604, 606, and 608. The multiplexer circuits 602 and 604 receive control signals OUTEN0 and the multiplexer circuits 606 and 608 receive control signals OUTEN180. The control signals OUTEN0 and OUTEN180 may be provided by an output control circuit. For example, the output control circuit 350 or the output control circuit 450 may provide the control signals OUTEN0 and OUTEN180 in an embodiment of the disclosure. The multiplexer circuits 602, 604, 606, and 608 are two-to-one multiplexer circuits. When activated by either the control signal OUTEN0 or OUTEN180, each of the multiplexer circuits 602, 604, 606, and 608 provides data at one of two inputs as an output, as controlled by a respective control signal MUXSEL. The multiplexer circuits 602 and 606 are controlled by the control signal MUXSEL0 and the multiplexer circuits 604 and 608 are controlled by the control signal MUXSEL180. The control signals MUXSEL0 and MUXSEL180 have a clock frequency that is half of the clock frequency of the IWCK clock signals. The control signal MUXSEL0 clocks between high and low clock levels while the control signal OUTEN0 is active (e.g., high logic level). The control signal MUXSEL180 clocks between high and low clock levels while the control signal OUTEN180 is active (e.g., high logic level). The multiplexer circuit 602 receives data bits D0 and D4, the multiplexer circuit 604 receives data bits D1 and D5, the multiplexer circuit 606 receives data bits D2 and D6, and the multiplexer circuit 608 receives data bits D3 and D7.

The read data output circuit 600 further includes a multiplexer circuit 610. The multiplexer circuit 610 is a four-to-one multiplexer circuit. The multiplexer circuit 610 provides data at one of four inputs as an output, as controlled by the IWCK clock signals. The multiplexer circuit 610 receives data in parallel and provides the data in a serial manner. The multiplexer circuit 610 includes logic circuits 612, 614, 616, and 618. In an embodiment of the disclosure, the logic circuits 612, 614, 616, and 618 are AND logic circuits, as shown in FIG. 6A. The logic circuit 612 receives the IWCK0 and IWCK270 clock signals, and further receives data bit D0 or D4 from the multiplexer circuit 602. The logic circuit 614 receives the IWCK0 and IWCK90 clock signals, and further receives data bit D1 or D5 from the multiplexer circuit 604. The IWCK90 clock signal has a 90 degree phase relationship relative to the IWCK0 clock signal. The logic circuit 616 receives the IWCK90 and IWCK180 clock signals, and further receives data bit D2 or D6 from the multiplexer circuit 606. The logic circuit 618 receives the IWCK180 and IWCK270 clock signals, and further receives data bit D3 or D7 from the multiplexer circuit 608. As the IWCK clock signals clock between high and low clock levels, the data bits D0-D7 are provided serially as output data DQ.

Figure 7:
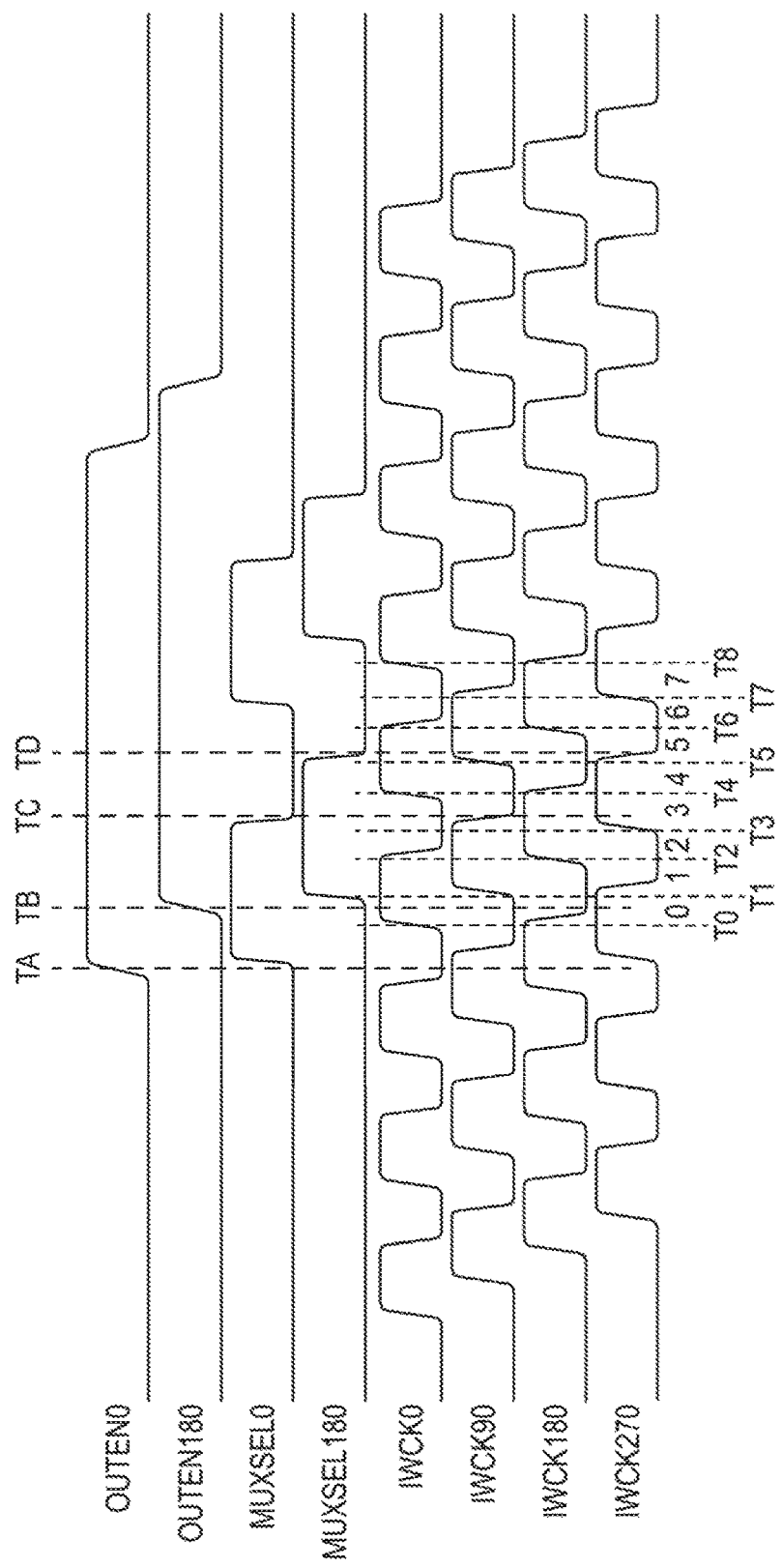
FIG. 7 is a timing diagram showing various signals during operation of the read data output circuit of FIG. 6A according to an embodiment of the disclosure.

Operation of the read data output circuit 600 will be described with reference to FIG. 7. FIG. 7 is a timing diagram showing various signals during operation of the read data output circuit 600 according to an embodiment of the disclosure.

At time TA, the control signal OUTEN0 changes to a high logic level, activating the multiplexer circuits 602 and 604. In response to the high logic level OUTEN0 control signal, the control signal MUXSEL0 changes to a high logic level to control the multiplexer circuit 602 to provide data bit D0 to the multiplexer circuit 610. The high logic level MUXSEL0 control signal is also provided to the multiplexer circuit 606, but it has not been activated at time TA (i.e., low logic level OUTEN180 control signal). With the data bit D0 provided to the logic circuit 612, and both the IWCK0 and IWCK270 clock signals at a high clock level, the logic circuit 612 provides the data bit D0 as output data DQ between times T0 and T1.

At time TB, the control signal OUTEN180 changes to a high logic level, activating the multiplexer circuits 606 and 608. In response to the high logic level OUTEN180 control signal, the control signal MUXSEL180 Changes to a high logic level to control the multiplexer 604 to provide data bit D1 to the multiplexer circuit 610. With the data bit D1 provided to the logic circuit 614, and both the IWCK0 and IWCK90 clock signals at a high clock level, the logic circuit 614 provides the data bit D1 as output data DQ between times T1 and T2. Additionally, with the multiplexer circuit 606 activated by the high logic level control signal OUTEN180 and the high logic level control signal MUXSEL0, the data bit D2 is provided to the logic circuit 616 of the multiplexer circuit 610. The logic circuit 616 does not provide the data bit D2 as the output data DQ until between times T2 and T3 when the IWCK90 and IWCK180 clock signals are both at a high clock level. Additionally, with the multiplexer circuit 608 activated by the high logic level control signal OUTEN180 and the high logic level control signal MUXSEL180, the data bit D3 is provided to the logic circuit 618 of the multiplexer circuit 610. The logic circuit 618 does not provide the data bit D3 as the output data DQ until between times T3 and T4 when the IWCK180 and IWCK270 clock signals are both at a high clock level.

At time TC, the control signal MUXSEL0 changes to a low logic level to control the multiplexer circuit 602 to provide the data bit D4 to the logic circuit 612. With the data bit D4 provided to the logic circuit 612, and both the IWCK0 and IWCK270 clock signals at a high clock level, the logic circuit 612 provides the data bit D4 as output data DQ between times T4 and T5. At time TD, the control signal MUXSEL180 changes to a low logic level to control the multiplexer circuit 604 to provide data bit D5 to the logic circuit 614. With the data bit D5 provided to the logic circuit 614, and both the IWCK0 and IWCK90 clock signals at a high clock level, the logic circuit 614 provides the data bit D5 as output data DQ between times T5 and T6.

With the multiplexer circuit 606 activated by the high logic level control signal OUTEN180 and the low logic level control signal MUXSEL0, the data bit D6 is provided to the logic circuit 616 of the multiplexer circuit 610. The logic circuit 616 does not provide the data bit D6 as the output data DQ until between times T6 and T7 when the IWCK90 and IWCK180 clock signals are both at a high clock level. Additionally, with the multiplexer circuit 608 activated by the high logic level control signal OUTEN180 and the low logic level control signal MUXSEL180, the data bit D7 is provided to the logic circuit 618 of the multiplexer circuit 610. The logic circuit 618 does not provide the data bit D7 as the output data DQ until between times T7 and T8 when the IWCK180 and IWCK270 clock signals are both at a high clock level.

As illustrated by the previous example, the read data output circuit 600 receives eight bits of data in parallel and provides the eight bits serially according to multiphase IWCK clock signals. Although not shown in the timing diagram, in another embodiment of the disclosure, another eight data bits may be provided immediately following the eight data bits output between times T0 and T8. The following eight data bits may be provided in parallel immediately following time T8 and the control signals OUTEN0 and OUTEN180 extended to twice the length. As a result, the first bit of the following eight bits (i.e., data bit D9) would be provided at time T8, and the following seven bits would be sequentially provided serially from the multiplexer circuit 610 as the multiphase IWCK clock signals clock.

Figure 8:
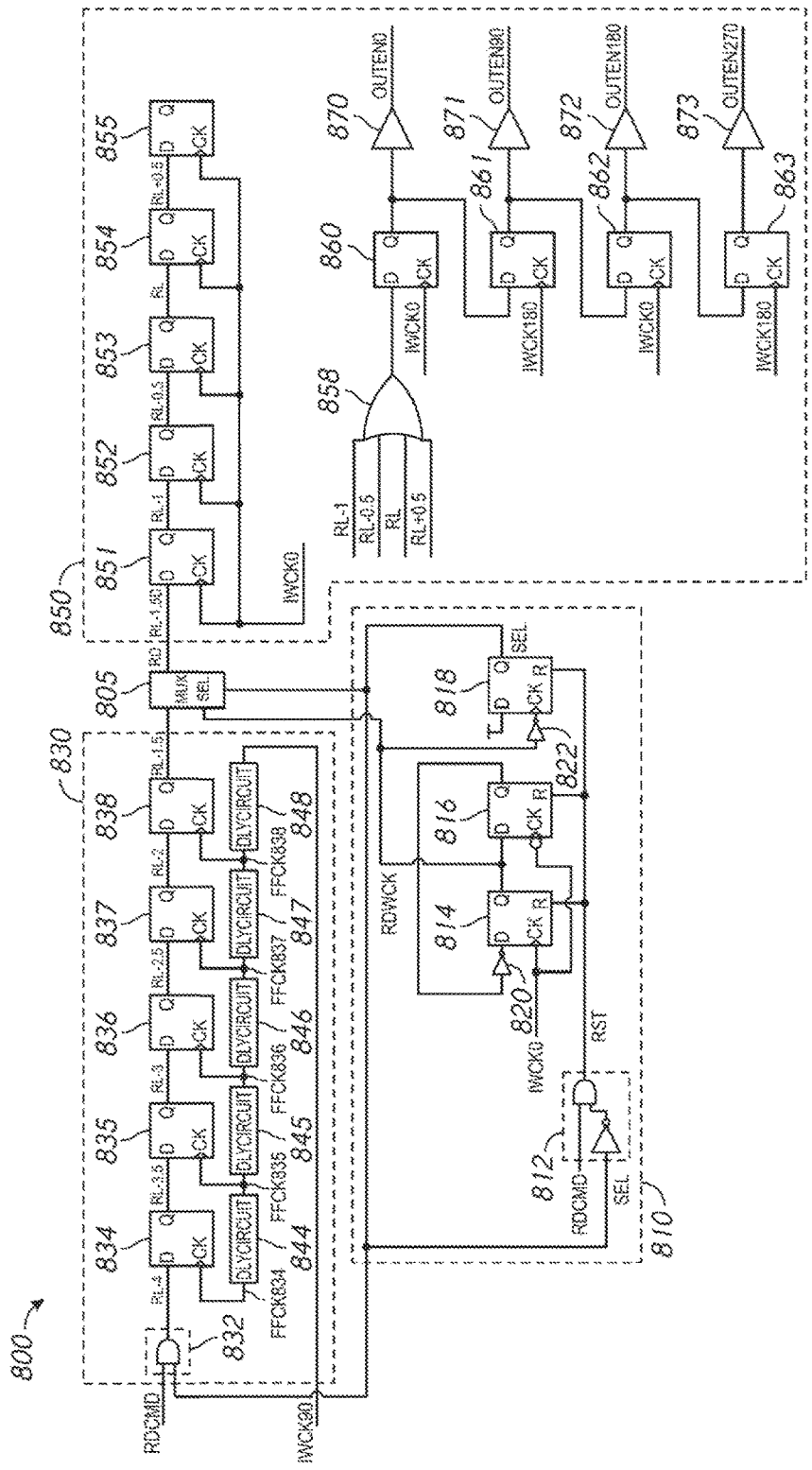
FIG. 8 is a schematic diagram of a read command circuit according to an embodiment of the disclosure.

FIG. 8 is a schematic diagram of a read command circuit 800 according to an embodiment of the disclosure. The read command circuit 800 may be used for the read command circuit 230 of FIG. 2 or the read command circuit 300 of FIG. 3. The read command circuit 800 includes a WCK clock read command circuit 810 and a CK clock read command circuit 830. The WCK clock read command circuit 810 provides an internal read command RDWCK responsive to a multiphase clock signal IWCK. As previously described, the multiphase IWCK clock signals may be based on the WCK_t and WCK_c clock signals and have a clock frequency one-half of the clock frequency of the WCK_t and WCK_c clock signals. The multiphase IWCK clock signals may include four phase clock signals IWCK0, IWCK90, IWCK180, and IWCK270.

The CK clock read command circuit 830 provides an internal read command RDCK responsive to the read command RDCMD. The read command circuit 800 further includes a multiplexer circuit 805. The CK clock read command circuit 830 provides the internal read command RDCK to a first input of the multiplexer circuit 805 and the WCK clock read command circuit 810 provides the internal read command RDCWK to a second input of the multiplexer circuit 805. The multiplexer circuit 805 provides either the RDCK or RDWCK internal read command and an internal read command RD based on a control signal SEL.

As will be described in more detail below, the read command circuit 800 may be used to provide an initial internal read command RD responsive to the activation (e.g., start) of the WCK clock signal (e.g., represented by an initial clock edge of the WCK clock signal), and further provide subsequent read commands RD thereafter responsive to subsequent read commands RDCMD. The timing of the initial and subsequent internal read commands RD provided by the read command circuit 800 provide proper timing for the semiconductor device 100 in providing output data DQ relative to receipt of external read commands READ according to a read latency RL.

The WCK clock read command circuit 810 includes an input logic circuit 812 that receives the read command RDCMD and the control signal SEL. The input logic circuit 812 includes an AND logic circuit and an inverter. The WCK clock read command circuit 810 further includes flip-flop (FF) circuits 814, 816, and 818. An output of the FF circuit 816 is coupled through an inverter 820 to a data input of the FF circuit 814. An output of the FF circuit 814 provides the internal read command RDWCK to the multiplexer circuit 805. The FF circuits 814 and 816 receive at respective clock inputs a multiphase clock signal IWCK. The multiphase clock signal IWCK may be provided by an internal clock generator of the semiconductor device 100, for example, the internal clock generator 130. The multiphase clock signal IWCK0 may be provided to the FF circuits 814 and 816 in an embodiment of the disclosure, as illustrated in FIG. 8. The output of the FF circuit 814 is also coupled through an inverter 822 to a clock input of the FF circuit 818. An output of the FF circuit 818 provides the control signal SEL to the multiplexer circuit 805, and to the input logic circuit 812. The input logic circuit 812 provides a reset signal RST to the FF circuits 814, 816, and 818.

The CK clock read command circuit 830 includes an input logic circuit 832 that receives the read command RDCMD and the control signal SEL. The input logic circuit 832 includes an AND logic circuit. The CK clock read command circuit 830 further includes FF circuits 834, 835, 836, 837,

838. The FF circuits 834-838 are coupled in series and are each clocked by a respective clock signal FFCK834, FFCK835, FFCK836, FFCK837, and FFCK838. The CK clock read command circuit 830 further includes delay circuits 844, 845, 846, 847, and 848. The delay circuits 844-848 are coupled in series and each provides a respective clock signals FFCK834-FFCK838. For example, the delay circuit 844 provides the clock signal FFCK834, the delay circuit 845 provides the clock signal FFCK835, the delay circuit 846 provides the clock signal FFCK836, the delay circuit 847 provides the clock signal FFCK837, and the delay circuit 848 provides the clock signal FFCK838. The delay circuit 848 receives one of the IWCK clock signals. The IWCK90 clock signal may be received by the delay circuit 848 in an embodiment of the disclosure, as shown in FIG. 8. The IWCK90 clock signal has a 90 degree phase relationship relative to the IWCK0 clock signal.

Each succeeding clock signal provided by the delay circuits 844-848 has greater delay relative to a preceding clock signal and to the IWCK90 clock signal. For example, the FFCK837 clock signal has a delay relative to the FFCK838 clock signal, and greater relative delay to the IWCK90 clock signal than the FFCK838 clock signal. Similarly, the FFCK836 clock signal has a delay relative to the FFCK837 clock signal, and greater relative delay to the IWCK90 clock signal than the FFCK837 clock signal. The FFCK834 clock signal has the greatest delay relative to the IWCK90 clock signal of the FFCK clock signals.

The delay circuits 844-848 provide additional delay to the IWCK clock signals so that the FF circuit 834 is clocked by the FFCK834 clock signal at a time when the read command RDCMD is available to the latched. The time for the read command RDCMD to reach the input logic circuit 832 is greater than the time for the IWCK clock signal to reach the FF circuit 834 due to delay from, for example, decoding an external read command to provide the read command RDCMD, and then propagating through the read command path, for example, through a read latency timing circuit. The delay circuits 844-848 provide additional delay for the difference in propagation time between the read command RDCMD and activate IWCK clock signals.

The read command circuit 800 further includes an output control circuit 850. The output control circuit 850 includes series coupled FF circuits 851-855. Each of the FF circuit 851-855 receive at a respective clock input the IWCK0 clock signal. The output of each of the FF circuits 851-855 are provided to a logic circuit 858. In an embodiment of the disclosure, the logic circuit 858 may be an OR logic circuit, as shown in FIG. 8. Each of the FF circuits 851-855 provides a respective output to the logic circuit 858. The FF circuit 852 receives the internal read command RD from the multiplexer circuit 805. The output control circuit 850 may further include series coupled FF circuits 860-863. The FF circuit 860 receives at a data input an output from the logic circuit 858. The FF circuits 860 and 862 receive the IWCK0 clock signal and FF circuits 861 and 863 receive the IWCK180 clock signal. The FF circuit 860 provides a control signal OUTEN0 through driver circuit 870, the FF circuit 861 provides a control signal OUTEN90 through driver circuit 871, the FF circuit 862 provides a control signal OUTEN180 driver circuit 872, and the FF circuit 863 provides a control signal OUTEN270 driver circuit 873. The control signals OUTEN0, OUTEN90, OUTEN180, and OUTEN270 may be used to activate output circuits to provide read data for an associated read command.

The read command circuit 400 provides additional delay to the read command RDCMD so that the control signals OUTEN0, OUTEN90, OUTEN180, and OUTEN270 are provided with a timing to satisfy the read latency information RL. In the embodiment of FIG. 8, the read command circuit 800 adds 4.0 clock cycles of the IWCK clock signals. The WCK clock command circuit 830 adds an additional 2.5 clock cycles of the IWCK clock signals of delay the read command RDCMD as it is propagated through the FF circuits 834-838. The output control circuit 450 adds another 1.5 clock cycles of the IWCK clock signals before the control signal OUTEN0 is first provided based on the internal read command RDCK. Thus, a total of 4.0 clock cycles of the IWCK clock signals of additional delay is added to provide the control signals OUTEN0, OUTEN90, OUTEN180, and OUTEN270 with timing to satisfy the read latency information RL.

In operation, responsive to a read command RDCMD, the input logic circuit 812 provides an active reset RST (e.g., high logic level RST signal). The active reset signal RST causes the FF circuits 814, 816, and 818 to reset and each provide a low logic level output. The low logic level output of the FF circuit 816 results in the inverter 820 providing a high logic level input to the data input of the FF circuit 814. The low logic level output of the FF circuit 818 provides a low logic level control signal SEL, which causes the multiplexer circuit 805 to provide the internal read command RDWCK as the internal read command RD. The low logic level control signal SEL also causes the input logic circuit 832 of the CK clock read command circuit 830 to prevent the read command RDCMD from being provided to a data input of the FF circuit 834.

In response to activation of the IWCK0 clock signal (e.g., an initial clock edge of the IWCK0 clock signal), the FF circuit 814 latches the high logic level input and provides a high logic level output. The high logic level output of the FF circuit 814 is provided to the data input of the FF circuit 816, the multiplexer circuit 805, and to the inverter 822. The high logic level output of the FF circuit 814 represents the internal read command RDWCK, which is provided through the multiplexer circuit 805 as an initial internal read command RD. Thus, the activation of the IWCK0 clock signal results in providing an initial internal read command RD to the output control circuit 850.

In response to a falling clock edge of the IWCK0 clock signal following the initial rising clock edge, the FF circuit 816 latches the high logic level at its data input and provides a high logic level output. The high logic level output of the FF circuit 816 causes a low logic level at the data input of the FF circuit 814, which is latched and provided in response to a next rising clock edge of the IWCK0 clock signal. The low logic level output of the FF circuit 814 causes the FF circuit 818 to latch a high logic level at its data input (as provided by a supply voltage) and provide a high logic level control signal SEL. The resulting high logic level control signal SEL causes the multiplexer circuit 805 to provide internal read commands RDCK from the CK clock read command circuit 830 as the internal read commands RD. As a result, although the FF circuits 814 and 816 continue being clocked by the IWCK0 clock signal, the output of the FF circuit 814 is not provided as the internal read command RD by the multiplexer circuit 805 because the control signal SEL remains at a high logic level due to the constant high logic level provided to the data input of the FF circuit 818.

As previously described, upon reset of the FF circuit 814, 816, and 818 responsive to the initial read command RDCMD, the FF circuit 818 provides a low logic level control signal SEL. The low logic level control signal SEL causes the input logic circuit 832 of the CK clock read command circuit 830 to prevent the read command RDCMD from being provide to a data input of the FF circuit 834. However, when the control signal SEL provided by the FF circuit 818 changes to a high logic level, the read command RDCMD may be provided to the data input of the FF circuit 834 through the AND logic circuit. In response to a rising clock edge of the FFCK834 clock signal, the FF circuit 834 latches and provides a high logic level output to the FF circuit 835. In response to a following rising clock edge of the FFCK835 clock signal, the FF circuit 835 latches and provides a high logic level output to the FF circuit 836. As the other FF circuits 836-838 latch and provide a high logic level output responsive to the rising edges of the FFCK836-FFCK838 clock signals, the read command RDCMD is propagated through the FF circuits 834-838 over several clock cycles of the IWCK90 clock signal. The FF circuit 838 provides the time shifted read command RDCMD as the internal read command RDCK to the multiplexer circuit 805 after being latched by the FF circuit 838.

By the time the read command RDCMD has propagated through the FF circuits 834-838 to be provided as the internal read command RDCK, the multiplexer circuit 805 is controlled to provide the internal read command RDCK as the internal read command RD. In particular, the FF circuit 818 of the WCK clock read command circuit 810 provides a high logic level control signal SEL to the multiplexer circuit 805 before the read command RDCMD is output by the FF circuit 838 as the internal read command RDCK. As a result, the internal read command RDCK is provided by the multiplexer circuit 805 as the internal read command RD.

The internal read command RD is provided to the FF circuit 851 of the output control circuit 850. The internal read command is shifted through the FF circuits 851-855, each providing a high logic level output responsive to a rising edge of the IWCK0 clock signal. As each of the FF circuits 851-858 provides a respective high logic level to the logic circuit 858, the high logic level is shifted through the FF circuits 860-863 responsive to the IWCK0 and IWCK180 clock signals. As the high logic level is shifted through the FF circuits 860-863, each FF circuit provides an active respective one of the control signals OUTEN0, OUTEN90, OUTEN180, and OUTEN270. As previously described, the OUTEN0, OUTEN90, OUTEN180, OUTEN270 control signals may be used to activate output circuits to provide read data for an associated read command.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a multiphase clock circuit configured to receive a first input clock signal and provide a plurality of multiphase clock signals responsive thereto, the multiphase clock signals having a first frequency and including clock signals having a phase relative to one another;
   a read latency timing circuit configured to receive read commands and latency information, the read latency timing circuit configured to provide delayed read commands having a delay relative to the respective read command based on the latency information; and
   a read command circuit configured to receive the delayed read commands and the plurality of multiphase clock signals, the read command circuit configured to provide respective control signals for each delayed read command, the read command circuit configured to provide initial control signals for an initial delayed read command (first RDCMD) wherein a timing of the initial control signals are relative to activation of a clock signal of the plurality of multiphase clock signals and to further provide respective control signals for a subsequent delayed read command wherein a timing of the respective control signals for the subsequent delayed read command are relative to receipt of the subsequent delayed read command.

2. An apparatus, comprising:
   a multiphase clock circuit configured to receive a first input clock signal and provide a plurality of multiphase clock signals responsive thereto, the multiphase clock signals including clock signals having a phase relative to one another;
   a read latency timing circuit configured to receive read commands and latency information, the read latency timing circuit configured to provide delayed read commands having a delay relative to the respective read command based on the latency information; and
   a read command circuit configured to receive the delayed read commands and the plurality of multiphase clock signals, the read command circuit configured to provide respective control signals for each delayed read command, the read command circuit configured to provide initial control signals for an initial delayed read command (first RDCMD) wherein a timing of the initial control signals are relative to activation of a clock signal of the plurality of multiphase clock signals and to further provide respective control signals for a subsequent delayed read command wherein a timing of the respective control signals for the subsequent delayed read command are relative to receipt of the subsequent delayed read command, wherein the read command circuit comprises:
      a first clock read command circuit configured to receive the clock signal of the plurality of multiphase clock signals and provide a first internal read command responsive to a first clock edge of the clock signal of the plurality of multiphase clock signals;
      a second clock read command circuit configured to receive the subsequent delayed read command and provide a second internal read command responsive to the subsequent delayed read command;
      a multiplexer circuit configured to provide the first internal read command or the second internal read command based at least in part on a multiplexer control signal; and
      an output control circuit configured to receive the first and second internal read commands, and configured to provide the initial control signals responsive to the first internal read commands and provide the respective control signals for the subsequent delayed read command responsive to the subsequent delayed read command.

3. The apparatus of claim 2 wherein the first clock read command circuit comprises:
   a plurality of series coupled flip-flop (FF) circuits, wherein first and second FF circuits of the plurality of series coupled FF circuits are configured to receive the clock signal of the plurality of multiphase clock signals at respective clock inputs and a third FF circuit of the plurality of series coupled FF circuits is configured to receive at a respective clock input an output of the second FF circuit.

4. The apparatus of claim 3 wherein the second FF circuit of the plurality of series coupled FF circuits is configured to provide the first internal read command to the multiplexer circuit and the third FF circuit of the plurality of series coupled FF circuits is configured to provide the multiplexer control signal to the multiplexer circuit.

5. The apparatus of claim 2 wherein the second clock read command circuit comprises:
a plurality of series coupled FF circuits wherein a first FF circuit of the plurality of series coupled FF circuits is configured to receive the subsequent delayed read command and wherein the plurality of series coupled FF circuits are configured to shift the subsequent delayed read commands therethrough according to a second clock signal of the plurality of multiphase clock signals and provide the second internal read command from a third FF circuit of the plurality of series coupled FF circuits.

6. The apparatus of claim 5 wherein the second clock read command circuit further includes a plurality of series coupled delay circuits configured to delay the second clock signal of the plurality of multiphase clock signals, each delay circuit of the plurality of series coupled delay circuits configured to provide a delayed clock signal to a clock input of a respective one of the plurality of series coupled FF circuits.

7. The apparatus of claim 2 wherein the output control circuit comprises:
a plurality of series coupled flip-flop (FF) circuits, each of the plurality of series coupled FF circuits clocked by a first clock signal of the plurality of multiphase clock signals, wherein a first of the plurality of series coupled FF circuit configured to receive the first and second internal commands;
a logic circuit configured to receive outputs from the plurality of series coupled FF circuits, the logic circuit configured to perform a logic operation on the outputs from the plurality of series coupled FF circuits and provide an output;
a first output FF circuit configured to receive the output from the logic circuit, the first output FF circuit configured to clocked by a second clock signal of the plurality of multiphase clock signals and provide a first control signal of the control signals; and
a second output FF circuit configured to receive the first control signal from the first output FF circuit, the second output FF circuit configured to clocked by the clock signal of the plurality of multiphase clock signals and provide a second control signal of the control signals.

8. The apparatus of claim 1 wherein:
the read command circuit is further configured to receive a clock signal of the plurality of multiphase clock signals and provide a first internal read command responsive to a first clock edge of the clock signal of the plurality of multiphase clock signals; and
in response to the first internal read command, the multiphase clock circuit is further configured to provide the plurality of multiphase clock signals having a second frequency that is higher than the first frequency.

9. An apparatus, comprising:
a command path configured to receive read commands and provide respective control signals for each read command, the command path configured to provide initial control signals for an initial read command responsive to a first clock edge of a clock signal of a plurality of multiphase clock signals and to further provide respective control signals for subsequent read commands responsive to receipt of the subsequent read commands; and
a read data output circuit configured to receive the control signals from the command path and further receive read data in parallel, the read data output circuit configured to provide the read data serially responsive to the control signals.

10. The apparatus of claim 9 wherein the command path comprises:
a read latency timing circuit configured to receive the read commands and provide delayed read commands having a delay relative to the read command based on read latency information; and
a read command circuit configured to receive the delayed read commands and provide the initial and respective control signals to the read data output circuit.

11. The apparatus of claim 10 wherein the read command circuit comprises:
a first read command circuit configured to provide the initial read command responsive to the first clock edge of the clock signal of the plurality of multiphase clock signals;
a second read command circuit configured to provide the subsequent read commands responsive to receive of the subsequent read commands;
a multiplexer circuit configured to provide the initial read command or the subsequent read commands based on a control signal; and
an output control circuit configured to receive the initial read command and provide the initial control signals and further receive the subsequent read commands and provide the respective control signals.

12. The apparatus of claim 9 wherein the read data output circuit comprises:
a plurality of multiplexer circuits, each configured to receive two bits of the read data and provide one of the two bits of the read data as a respective output; and
an output multiplexer circuit configured to receive a respective bit from each of the plurality of multiplexer circuits and receive the plurality of multiphase clock signals, and configured to serially provide the bits from the plurality of multiplexer circuits according to the plurality of multiphase clock signals.

13. The apparatus of claim 9 wherein the output control circuit is configured to receive eight bits of read data in parallel and serially provide the eight bits of read data over two clock cycles of a clock signal of the plurality of multiphase clock signals.

14. The apparatus of claim 9, further comprising:
a multiphase clock circuit configured to receive an internal clock signal having a first clock frequency and provide the plurality of multiphase clock signals, wherein the plurality of multiphase clock signals have a second clock frequency that is less than the first clock frequency.

15. The apparatus of claim 14 wherein the second clock frequency is one-half of the first clock frequency.

16. An apparatus, comprising:
a command decoder configured to decode read commands and provide decoded read commands;
a command path coupled to the command decoder and configured to receive the decoded read commands and internal data clock signals, the command path configured to provide respective control signals for each decoded read command, the command path further configured to generate first control signals for a first decoded read command responsive to activation of the internal data clock signals and to generate second control signals for a second decoded read command responsive to the second decoded read command; and a read data output circuit coupled to the command path and configured to receive the control signals and further receive read data in parallel for each of the decoded read commands, the read data output circuit configured to serially provide the read data for the first decoded read command responsive to the first control signals and serially provide the read data for the second decoded read command responsive to the second control signals.

17. The apparatus of claim 16, further comprising a multiphase clock circuit configured to provide a plurality of multiphase clock signals responsive to an external clock signal, wherein the multiphase clock signals are provided as the internal data clock signals to the command path.

18. The apparatus of claim 17 wherein the external clock signals comprise complementary clock signals.

19. The apparatus of claim 16 wherein the command path comprises a read command circuit, the read command circuit comprising:

a first read command circuit configured to receive a first one of the internal clock signals and provide a first internal read command responsive to the activation of the first one of the internal clock signals;

a second read command circuit configured to receive a second one of the internal clock signals and provide a second internal read command responsive to the second decoded read command;

a multiplexer circuit configured to provide the first internal read command or the second internal read command; and an output control circuit configured to receive the first internal read command from the multiplexer circuit and generate the first control signals and configured to receive the second internal read command from the multiplexer circuit and generate the second control signals.

20. The apparatus of claim 16, wherein the read data output circuit comprises:

a plurality of multiplexer circuits configured to receive the read data in parallel and receive the first and second control signals, the plurality of multiplexer circuits configured to selectively provide the read data in parallel; and an output multiplexer circuit configured to receive the read data in parallel from the plurality of multiplexer circuits and configured to provide the read data serially according to the internal data clock signals.

\* \* \* \* \*